United States Patent [19]
Voldman

[11] Patent Number: 5,923,067
[45] Date of Patent: Jul. 13, 1999

[54] 3-D CMOS-ON-SOI ESD STRUCTURE AND METHOD

[75] Inventor: Steven Howard Voldman, South Burlington, Vt.

[73] Assignee: International Business Machines Corporation, Armonk, N.Y.

[21] Appl. No.: 08/833,364

[22] Filed: Apr. 4, 1997

[51] Int. Cl.[6] .......................... H01L 27/01; H01L 27/12; H01L 31/0392
[52] U.S. Cl. ......................... 257/349; 257/350; 257/351; 257/357; 257/360; 257/361; 257/362
[58] Field of Search .................................. 257/347, 351, 257/350, 349, 357, 358, 361, 362, 363, 360

[56] References Cited

U.S. PATENT DOCUMENTS

| | | | |
|---|---|---|---|
| 4,489,478 | 12/1984 | Sakurai | 29/574 |
| 4,596,604 | 6/1986 | Akiyama et al. | 148/1.5 |
| 4,612,083 | 9/1986 | Yasumoto et al. | 156/633 |
| 4,834,809 | 5/1989 | Kakihara | 148/33 |
| 4,902,637 | 2/1990 | Kondou et al. | 437/51 |
| 4,907,053 | 3/1990 | Ohmi | 357/23.1 |
| 4,989,057 | 1/1991 | Lu | 357/23.7 |
| 5,028,976 | 7/1991 | Ozaki et al. | 357/42 |
| 5,294,556 | 3/1994 | Kawamura | 437/21 |
| 5,294,821 | 3/1994 | Iwamatsu | 257/351 |
| 5,359,219 | 10/1994 | Hwang | 257/351 |
| 5,382,818 | 1/1995 | Pein | 257/347 |
| 5,382,832 | 1/1995 | Buti et al. | 257/773 |
| 5,399,507 | 3/1995 | Sun | 437/24 |
| 5,414,288 | 5/1995 | Fitch et al. | 257/328 |
| 5,422,302 | 6/1995 | Yonehara et al. | 437/83 |
| 5,426,062 | 6/1995 | Hwang | 437/21 |
| 5,426,072 | 6/1995 | Finnila | 437/208 |
| 5,473,181 | 12/1995 | Schwalke et al. | 257/350 |
| 5,521,401 | 5/1996 | Zamanian et al. | 257/67 |

FOREIGN PATENT DOCUMENTS

| | | | |
|---|---|---|---|
| 54-135570 | 10/1979 | Japan . | |
| 61-180466 | 8/1986 | Japan | 257/350 |

*Primary Examiner*—William Mintel
*Attorney, Agent, or Firm*—Howard J. Walter, Jr.

[57] ABSTRACT

Three-dimensional ESD structures are constructed in SOI technology that utilize both bulk devices and thin film SOI devices.

9 Claims, 7 Drawing Sheets

3-D CMOS-ON-SOI ESD STRUCTURE AND METHOD

BACKGROUND OF THE INVENTION

1. Field of the Invention

This invention relates generally to a method and apparatus for electrostatic discharge (ESD) protection in silicon-on-insulator (SOI) technologies and, more particularly, to a three-dimensional (3-D) ESD SOI structure.

2. Discussion of the Related Art

Metal oxide semiconductor field effect transistor (MOSFET) scaling on bulk silicon has been the primary focus of the semiconductor and microelectronic industry for achieving complementary metal oxide semiconductor (CMOS) chip performance and density objectives. The shrinking of MOSFET dimensions for high density, low power and enhanced performance requires reduced power-supply voltages. Because power consumption (P) is a function of capacitance (C), power supply voltage (V), and transition frequency (f), in accordance with the expression $P=CV^2f$, the focus has been on reducing both C and V as the transition frequency f increases. As a result, dielectric thickness and channel length are scaled with power-supply voltage. Power-supply reduction continues to be the trend for future low-voltage CMOS. However, with power supply reduction, transistor performance is severely impacted by both junction capacitance and the MOSFET body effect at lower voltages. As technologies scale below 0.25-$\mu$m channel lengths, to 0.15 and 0.1 $\mu$m, short-channel effects (SCE) control, gate resistance, channel profiling and other barriers become an issue for advanced CMOS technologies. While significant success has been achieved with successive scaling of bulk CMOS technology, the manufacturing control issues and power consumption will become more difficult with deal which to.

Using silicon-on-insulator (SOI) substrates, many of the concerns and obstacles of bulk-silicon CMOS can be eliminated at low power supply voltages. CMOS-on-SOI has significant advantages over bulk CMOS technology and will achieve the scaling objectives of low power and high performance for future technologies. CMOS-on-SOI provides low power consumption, low leakage current, low capacitance diode structures, good sub-threshold I–V characteristics (better than 60 mV/decade), a low soft error rate from both alpha particles and cosmic rays, good static random access memory (SRAM) access times, and other technology benefits. SOI process techniques include epitaxial lateral overgrowth (ELO), lateral solid-phase epitaxy (LSPE) and full isolation by porous oxidized silicon (FIPOS) as are known in the art.

SOI has not become a mainstream CMOS technology in view of the rapid improvement in bulk CMOS technology performance, however, SOI is a contender for mainstream CMOS applications. One of the barriers to implementing SOI as a mainstream CMOS technology is the "floating body" issue. Another barrier is electrostatic discharge protection (ESD). With respect to ESD protection, one problem with SOI is that there are no diodes natural to the process that are not in the presence of a polysilicon gate edge. The primary reason this is a concern is that electrical overload of the polysilicon gate structure occurs as well as the high capacitance per unit length in the SOI MOSFET structure.

ESD protection of SOI structures has been of interest for silicon-on-sapphire (SOS) and SOI applications. In early SOS/SOI literature, SOS and SOI were regarded as costly, having low volume, and capable of exotic applications where ESD robustness was more of a curiosity than a manufacturing necessity or supplier objective. To achieve ESD robustness in a mainstream SOI technology suitable for high volume commercial usage, ESD protection structures and circuitry must have low resistance and capacitance, as well as require only a small percentage of semiconductor chip area. Disadvantages of SOI ESD networks formed solely in the SOI layer include: 1) high thermal impedance to the bulk substrate, 2) thin films, 3) polysilicon gate structures, and 4) a lack of vertical silicon diodes. A high thermal impedance creates high surface temperatures in an SOI film thereby leading to thermal secondary breakdown in SOI devices formed in the SOI film. Thin film SOI devices also lead to an existence of high current densities, thus creating significant power/density constraints. In thin film SOI devices, the polysilicon gate structures create the existence of high capacitance structures and are prone to electrical overload and dielectric breakdown. A lack of vertical structures in SOI devices prevents electrical current from being dissipated to the underlying bulk substrate and thus forces construction of wide perimeter lateral structures. As a result, negative pulse SOI ESD protection is as difficult to provide as positive pulse SOI ESD protection. In bulk silicon, using comparatively smaller structures, ESD protection for negative mode pulses is easily achieved because of current dissipation to the bulk substrate; whereas, in SOI this is not true. The latter forces designers to allocate as much active silicon chip area for negative mode ESD protection as the positive mode ESD protection schemes.

Figure 1:
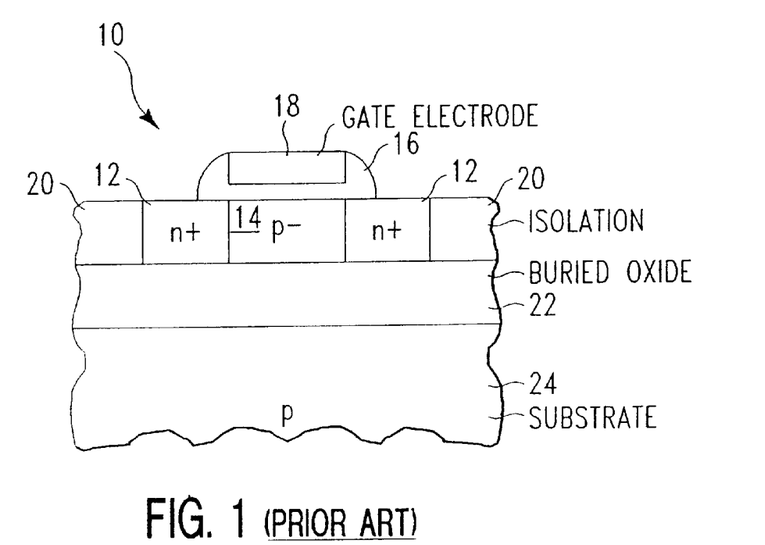
FIG. 1 illustrates the structure of a standard SOI MOSFET.

In the prior art, there are different alternatives suggested to date to achieve ESD protection. FIG. 1 is exemplary of an NMOSFET 10 including n+ source and drain regions 12, p-channel region 14, gate oxide and sidewall spacers 16, gate electrode 18, and isolation regions 20 formed over a buried oxide 22 and underlying p substrate 24, as is known in the art. It is known in the art to use standard circuits constructed in SOI for ESD protection. K. Verhaege et al. in "Analysis of Snapback in SOI NMOSFETs and its Use for an SOI ESD Protection Circuit," Proceedings of the IEEE SOI Conference, pp.140–141, 1992, and "Double Snapback in SOI NMOSFETs and its Application for SOI ESD Protection," IEEE Electron Device Lett., Vol. 14, No. 7, July 1993, pp.326–328, demonstrate the usage of an SOI MOSFET transistor as an ESD protection device. In U.S. Pat. No. 4,989,057, issued Jan. 29, 1991 to Lu, entitled "ESD Protection for SOI Circuits," demonstrates the usage of transistors in an SOI film for ESD protection. In another article by Voldman et al. entitled "CMOS-on-SOI ESD Protection Networks", EOS/ESD Proceedings, September 1996, it has been demonstrated that thin film SOI ESD devices can be constructed by configuring MOSFETs in diode modes of operation. One problem with thin film SOI ESD devices, however, is that SOI-based ESD circuits are worse than bulk devices by at least a factor of two (2X). In an article by M. Chan et al. entitled "Comparison of ESD Protection Capability of SOI and Bulk CMOS Output Buffers," IRPS 1994, it has been demonstrated that SOI circuits are 2X less ESD robust. To therefore attain a robustness comparable with bulk ESD protection then will require very large SOI ESD networks which will be unacceptable in size, or capacitance loading. Another problem in the art is that the known SOI ESD structures are all MOSFET based. The above mentioned SOI ESD structures all disadvantageously introduce a polysilicon gate structure. A main concern with the polysilicon gate structure is dielectric overload and high capacitance per unit width. The alternatives to SOI ESD protection, as discussed above, are unacceptable from a reliability and a functional perspective.

Figure 2:
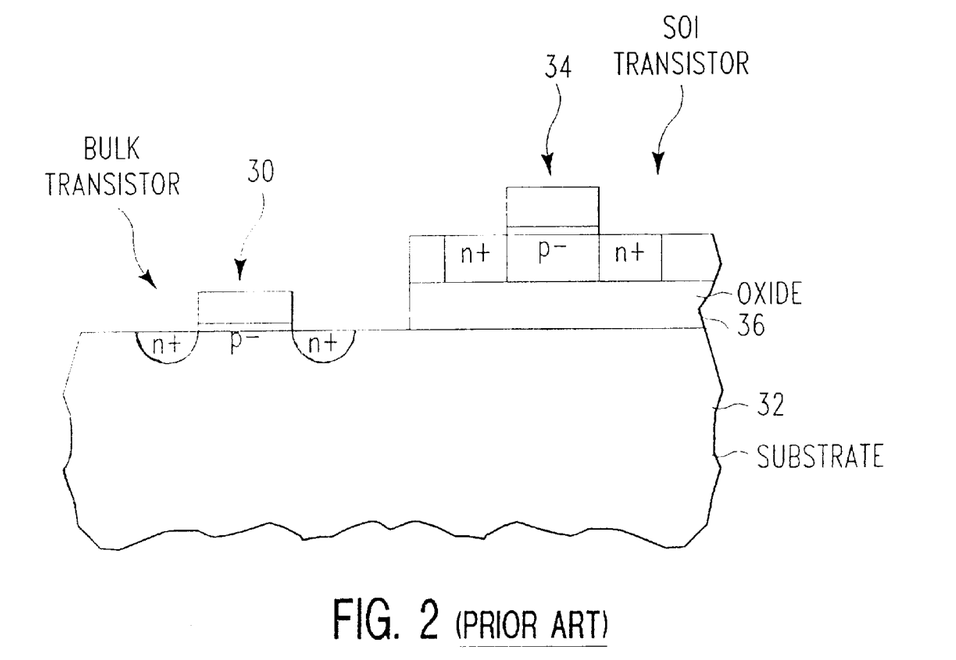
FIG. 2 illustrates a known structure demonstrating construction of a bulk MOSFET and an SOI MOSFET on the same bulk silicon wafer.

In other known implementations, CMOS-on-SOI structures have utilized bulk elements adjacent to the active core SOI circuitry. For example, U.S. Pat. No. 4,889,829, issued Dec. 26, 1989 to Kawai and entitled "Method for producing a semiconductor device having a silicon-on-insulator structure," discloses, referring now to FIG. 2, a method of building bulk transistors 30 in a substrate 32 and SOI transistors 34 on the insulating film 36 overlying the substrate 32 In the methodology of the '829 patent, it is required that the bulk transistor 30 be constructed adjacent to the active area structures 34 in the same plane. The method of Kawai thus disadvantageously requires additional semiconductor chip area devoted to the bulk transistors, as well as, introduces undesirable topography concerns. In other words, the method and structure taught by Kawai introduces a significantly varied topography, which would be unacceptable for high density and planarity integration applications.

Furthermore, U.S. Pat. No. 5,399,507, issued March, 1995 to Sun, entitled "Fabrication of Mixed Thin film and bulk semiconductor substrate for integrated circuit applications," discloses a mixed thin film and bulk semiconductor substrate. According to Sun, ESD devices are constructed in bulk silicon. An oxygen implant is masked for forming a buried insulating layer and core SOI devices are built over the insulating layer. In addition, ESD MOSFET structures are placed adjacent to active integrated circuits in the same physical silicon plane. While the teaching of Sun eliminates planarity concerns, it however leads to undesirable silicon dislocations, which are highly unacceptable from a manufacturing perspective. To avoid silicon dislocations, the active core SOI structures must be spatially separated to avoid yield concerns. The latter, however, introduces an area disadvantage. Whereas the proposed solutions thus far discussed solve the concern of building ESD networks in the thin SOI film, they do not resolve semiconductor manufacturing problems, yield and topography issues.

In the above discussed related art, no ESD solution has been proposed that uses ESD structures under active circuitry of a CMOS-on-SOI structure to eliminate the problem of an excessive consumption of semiconductor chip area. No three-dimensional structures are suggested or proposed as ESD solutions. Using a dual-gate MOSFET, as taught U.S. Pat. No. 4,907,053 issued Mar. 6, 1990 to in T. Ohmi, entitled "Semiconductor Integrated Circuit," the problem of back gate biasing in an SOI MOSFET transistor is addressed. T. Ohmi demonstrates that it is possible to construct a SOI MOSFET with a top gate and a bottom gate where the bottom gate is placed in the bulk and the top gate is above the SOI film. In the disclosure by T. Ohmi, the second bottom gate must be aligned directly under the channel region. The second gate is used only in a positive polarity so as to act with the utility of a back-plane to modulate the channel region of the insulator. T. Ohmi does not use the back gate for any function other than controlling the electrical potential of the back-plane. T. Ohmi, furthermore, does not demonstrate the existence of a second gate contained within a well structure. In addition, all of the above-mentioned structures introduce a polysilicon gate structure. The concern with a polysilicon gate structure is dielectric overstress, ESD, and high capacitance per unit width. The solutions, as discussed above, are unacceptable from a reliability and functional perspective.

SUMMARY OF THE INVENTION

The present invention addresses the problem of high perimeter, space intensive ESD networks by construction of three-dimensional SOI structures where the ESD networks are fabricated below an active core circuitry of an integrated circuit device.

The present invention also avoids the problem of high perimeter, high capacitance polysilicon gate structures by construction of diode-based ESD networks in a bulk silicon substrate beneath the active core circuitry of the integrated circuit device.

The present invention further addresses the problem of high perimeter, space intensive ESD networks by construction of three-dimensional SOI structures where the ESD networks are fabricated in the bulk silicon and in the SOI film either above or adjacent to the bulk ESD networks.

The present invention still further provides circuits and structures to prevent electrical overstress of thin film SOI active core circuitry.

In accordance with the present invention, solutions are provided for 1) construction of ESD networks that do not utilize large chip areas, 2) providing structures for ESD networks that utilize both bulk and thin film SOI ESD structures, and 3) avoidance of polysilicon gate structures, however, some embodiments may include polysilicon gate structures.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 3:
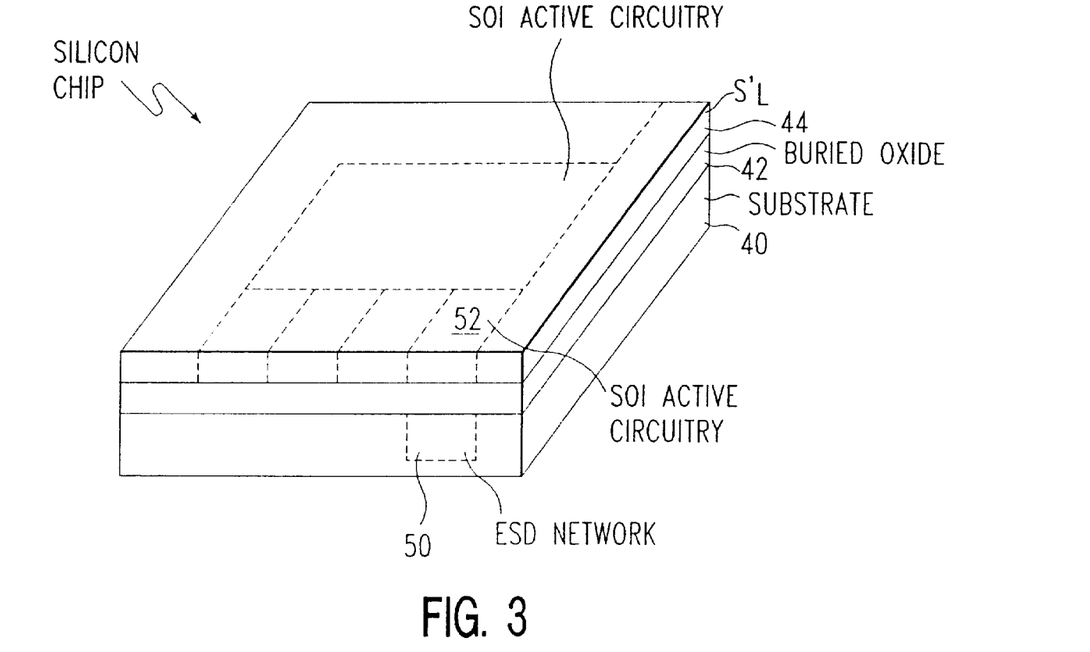
FIG. 3 shows a floor plan of bulk ESD networks under SOI active core circuitry in accordance with one embodiment of the present invention.
Figure 4:
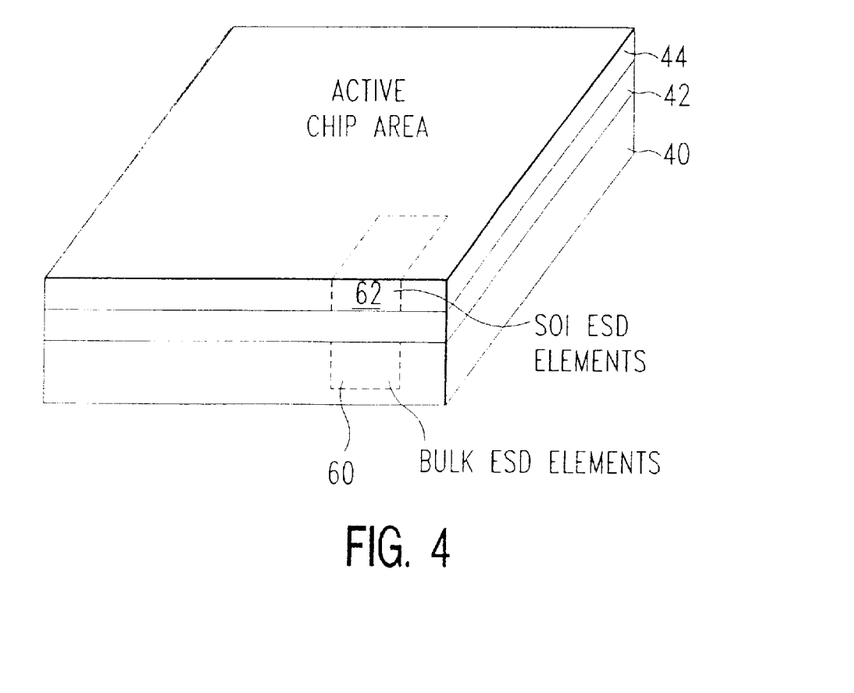
FIG. 4 shows another floor plan of bulk ESD elements under SOI ESD element circuitry in accordance with the present invention.

Turning now to the FIGS. 3 and 4, the three-dimensional (3-D) CMOS-on-SOI (Complementary-Metal-Oxide-Semiconductor on Silicon-on-Insulator) electrostatic discharge (ESD) structure according to the present invention includes a bulk substrate 40, a buried oxide layer 42, a thin silicon film 44, an active core structure in the thin silicon film, and an ESD structure placed under the active core structure. FIG. 3 shows a floor plan of bulk ESD networks 50 under SOI active core circuitry 52 in accordance with one embodiment of the present invention. In addition, FIG. 4 shows a floor plan of bulk ESD elements 60 under SOI ESD element circuitry 62 in accordance with another embodiment of the present invention.

In a preferred embodiment according to the present invention, the CMOS-on-SOI technology applies to a low voltage logic technology on the order of less than 5 volts. Structural features of the thin film portions of the ESD structures according to the present invention are defined by shallow-trench isolation (STI) which abuts the silicon dioxide film in the vertical profile, fully isolating corresponding transistor structures. Shallow-trench isolation eliminates planarity concerns and multidimensional oxidation effects, such as LOCOS bird's beak, thereby allowing technology migration and scaling to sub-0.25 $\mu$m technologies (i.e., sub-quarter micron technologies). Devices in the SOI silicon film and below the buried oxide (i.e., bulk devices) can be interconnected with known metallurgy and interconnect processes. For example, a damascene tungsten wiring technique can be used for a local MO wiring level (i.e., local interconnect). In the damascene process, a trench is etched in a dielectric, a film of metalization is deposited conformally, and then the metal is polished away until the metal only remains in the etched trench region. A dual damascene process may also be used, wherein the dual damascene process has two trench depths, allowing for filling both a wiring level and a contact. MO wiring is preferably used to improve current distribution in the ESD networks. The wiring may include titanium/aluminum, copper, or silicon/titanium wiring. Tungsten (W) studs are preferably used for contacts or vias to the Ti/Al—Cu—Si/Ti wiring. Silicon dioxide insulators are deposited using standard techniques and then planarized, for example, using chemical mechanical polishing techniques. The present invention, however, is not limited to the preferred isolation and wiring technologies, as discussed. STI isolation can be substituted for LOCOS and extended LOCOS type isolation. Al-based metallurgy on $SiO_2$ can be extended and inclusive of Cu-based metallurgy and low-K dielectric insulator films.

Figure 5:
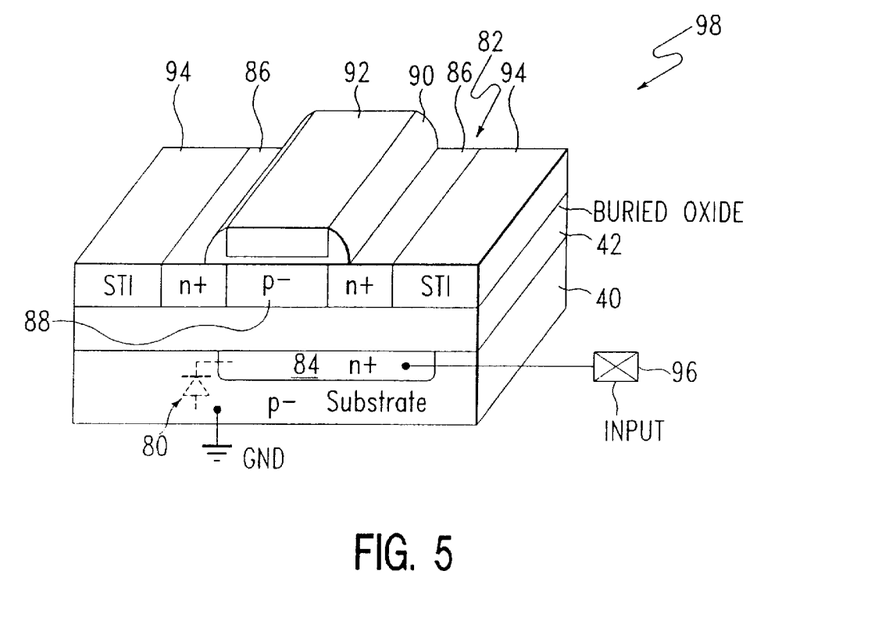
FIG. 5 illustrates a specific embodiment of an ESD bulk diode placed under a thin film SOI MOSFET in accordance with the present invention.

Turning now to FIG. 5, an ESD bulk diode 80 is shown placed under a thin film SOI MOSFET 82 in accordance with the present invention. In particular, an n-well 84 is placed under an active core structure which includes the SOI MOSFET 82. SOI MOSFET 82 includes n+ source and drain regions 86, p-channel region 88, gate oxide and sidewall spacers 90, gate electrode 92, and isolation regions 94 formed over buried oxide 42. Isolation regions 94 are shallow trench isolation regions known in the art. In this embodiment, n-well 84 is connected via an appropriate connection to an input pin or pad 96 of the semiconductor chip 98 of which the ESD structure is a part of and p-substrate 40 is connected to ground potential. A negative ESD pulse on the pin 96 would be effectively dissipated through the bulk ESD diode structure 80.

Figure 6:
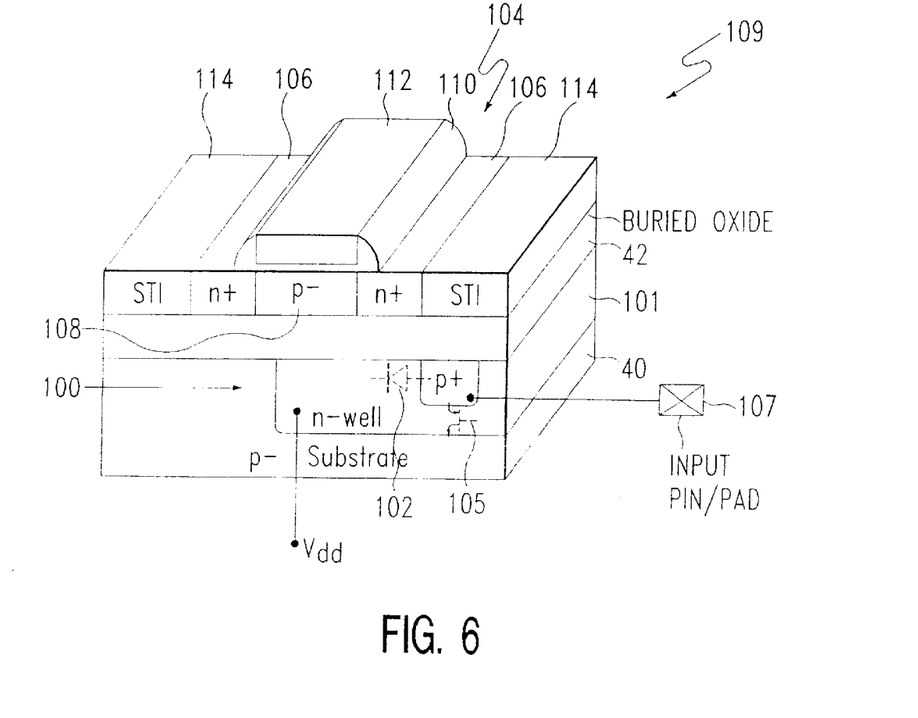
FIG. 6 illustrates another specific embodiment of an ESD network including a bulk diode placed below a thin film SOI MOSFET in a bulk well structure forming both a diode and bipolar element in accordance with the present invention.

FIG. 6 illustrates another specific embodiment of an ESD network 100 including a bulk diode 102 placed below a thin film SOI MOSFET 104. Bulk diode 102 is formed from a p+ implant 103 in a bulk n-well 101. Both a diode and a bipolar element 105 in accordance with the present invention are formed. The bipolar element 105 includes the p+ implant 103, the n-well 101 and the p-substrate 40. SOI MOSFET 104 includes n+ source and drain regions 106, p-channel region 108, gate oxide and sidewall spacers 110, gate electrode 112, and shallow trench isolation regions 114.

With the embodiment as shown in FIG. 6, p+ implant 103 can be connected via any suitable conductor to an input pin or pad 107 of the semiconductor chip 109 of which the ESD structure is a part of and n-well 101 can be connected to a power rail Vdd. Alternatively, n-well 101 could be connected to an input pin or pad of semiconductor chip 109 and p+ implant region 103 could be connected to ground.

Figure 7:
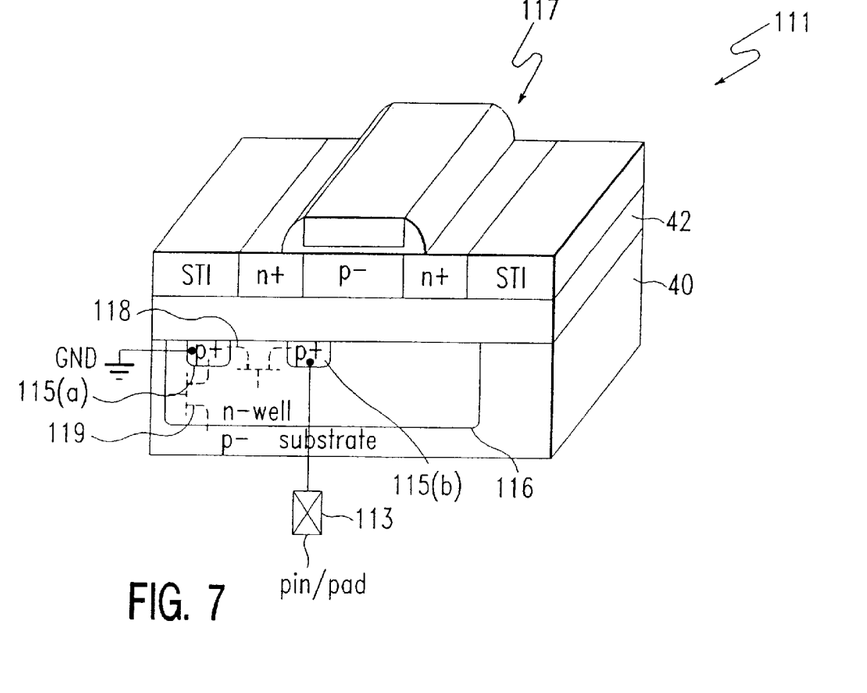
FIG. 7 illustrates another specific embodiment including two p+ implants placed in an n-well placed beneath thin film SOI active circuitry such as thin film SOI MOSFET transistors, where the two p+ implants and well region create a lateral pnp transistor as well as a vertical pnp transistor.

FIG. 7 illustrates another specific embodiment including a two p+ implants 115(a), 115(b) placed in an n-well 116 placed beneath thin film SOI active circuitry 117 such as thin film SOI MOSFET transistors (only one shown for simplicity). The two p+ implants 115(a) and 115(b) and well region 116 create a lateral pnp transistor 118, as well as, a vertical pnp transistor 119. In this case, the lateral pnp 118 or vertical pnp 119 can be used for ESD protection of the SOI MOSFETs 117 (only one shown). With the embodiment as shown in FIG. 7, p+ implant 115(a) may be connected to either ground or Vdd potential and p+ implant 115(b) may be connected by any suitable conductor to an input pin or pad 113 of the semiconductor chip 111 of which the ESD structure is a part of. Alternatively, p+ implant 115(a) may be connected to input pin or pad 113 and p+ implant 115(b) connected to either ground or Vdd potential. For positive ESD pulses, the pnp transistors will allow current to flow to either the substrate 40 or the p+ implant 115(a) or 115(b) that serves as the collector of the pnp lateral transistor 118, as the case may be. The well region 116 can also serve as a back gate bias plane for a SOI MOSFET structure in the silicon film of the SOI.

Figure 8:
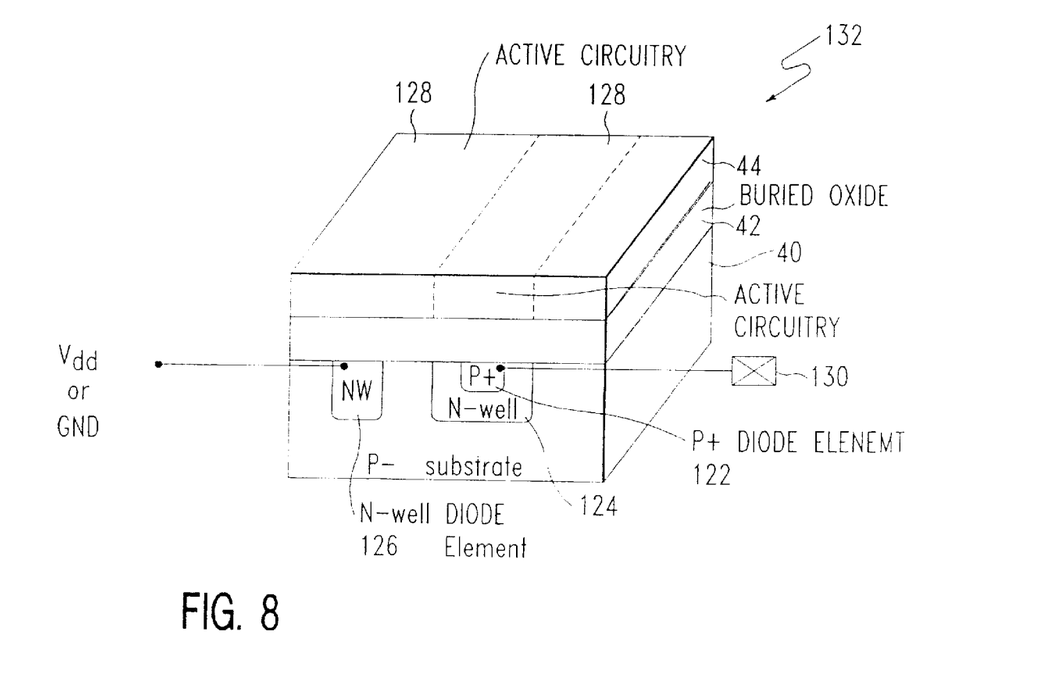
FIG. 8 illustrates another specific embodiment including a two-diode ESD network having a bulk p+ diode element placed in a well and a bulk n+ and/or n-well diode element placed beneath SOI active circuitry such as thin film SOI MOSFETS.

Turning now to FIG. 8, another specific embodiment in accordance with the present invention includes a two-diode ESD network 120. The two-diode ESD network 120 includes having a bulk p+ diode element 122 placed in an n-well 124 and a bulk n+ and/or n-well diode element 126 placed beneath SOI active circuitry 128, such as thin film SOI MOSFETs (not shown). The p+ implant element 122 is placed under the buried oxide film 42 and in the well structure 124. The well structure 124 is placed under the buried oxide film 42 also. The p+ implant 122 thus forms both a diode element, as well as a bipolar element in the bulk substrate 40. The bipolar element consists of the p+ implant 122, the n-well 124, and the p-substrate 40. An input pin or pad 130 of semiconductor chip 132 may be connected via any suitable conductor to p+ element 122 and n-well element 126 connected to either Vdd or ground potential for providing a desired ESD protection. The embodiment of FIG. 8 can also represent an ESD network including a bulk pnpn silicon-controlled rectifier (SCR) and the integrated circuit structure 128 includes an SOI MOSFET ESD network (not shown) positioned over the bulk pnpn SCR.

Figure 9:
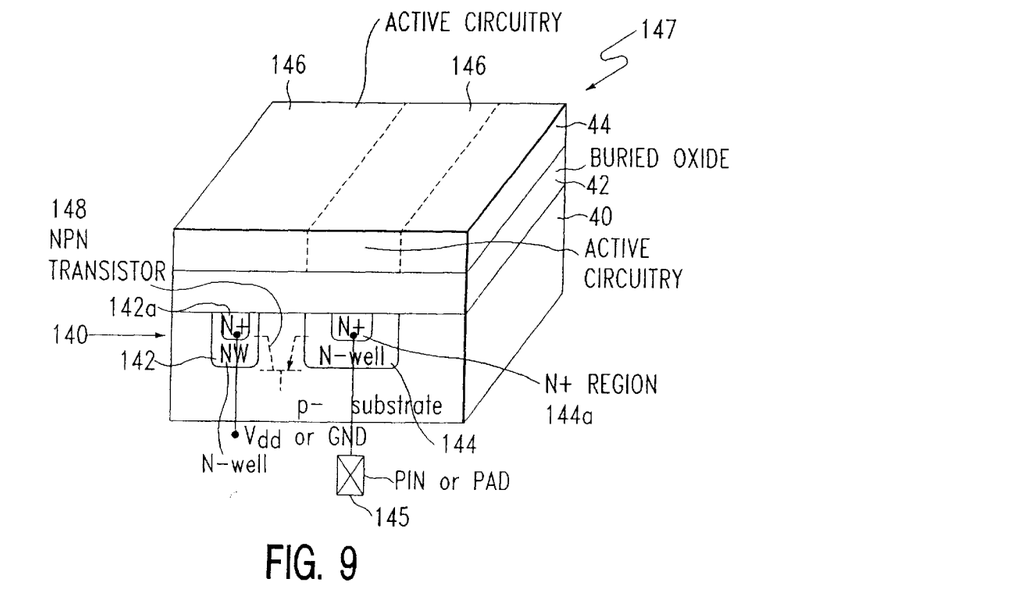
FIG. 9 illustrates another specific embodiment including two n-wells placed beneath thin film SOI active circuitry such as thin film SOI MOSFET transistors, where the two n-well implants form a lateral npn transistor in which the substrate acts as a base of the npn transistor.

FIG. 9 illustrates another specific embodiment of an ESD network 140 which includes two n-wells 142, 144 placed beneath thin film SOI active circuitry 146. The thin film SOI active circuitry 146 may include, for example, thin film SOI MOSFET transistors (not shown). The two n-well implants 142, 144 form a lateral npn transistor 148 wherein the substrate 40 acts as a base of the npn transistor 148. When a negative ESD pulse is applied to the first n-well 144, the lateral npn transistor 148 will discharge current either to the bulk substrate 42 or to the second n-well structure 142. The n-well implants 142, 144 may also include therein n+ implants 142a, 144a, as necessary, to achieve a desired ESD performance. For instance, n+ region 144a may be connected via any suitable conductor to a pin or pad 145 of the semiconductor chip 147 of which the ESD structure is a part of, and n+ region 142a may be connected to Vdd or ground. Alternatively, pin 145 may be connected to n+ region 142a while n+ region 144a is connected to either Vdd or ground. Still further, the ESD network as shown in FIG. 9 may be referred to as a bulk punch through device and the active integrated circuitry above the bulk punch through device can include an SOI grounded gate MOSFET (not shown) positioned over the bulk punch through device.

Figures 10, 10A, 10B:
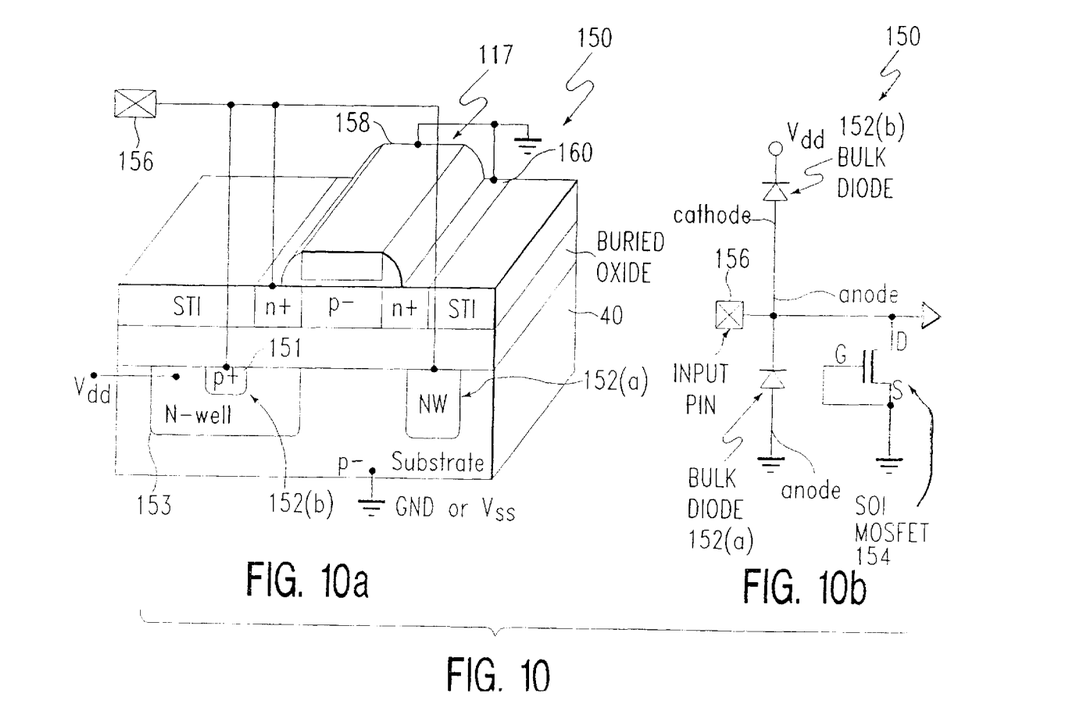
FIGS. 10(a) and 10(b) illustrate one embodiment of a two-stage ESD network including a circuit having both bulk ESD diodic elements and SOI thin film ESD elements.

FIG. 10(a) and FIG. 10(b) illustrate one embodiment of a two-stage ESD network 150 including a circuit having both bulk ESD diodic elements 152(a), and 152(b) and an SOI thin film ESD element 154. An input pin or pad 156 is connected via any suitable conductor to a first stage of the two-stage ESD network 150 between the cathode of bulk diode 152(a) and the anode of bulk diode 152(b). The input pin 156 is further connected via any suitable conductor to the second stage of the two-stage ESD network 150 at the drain of SOI MOSFET 154. The gate 158 and source 160 terminals of SOI MOSFET 154 are connected together and further referenced to ground. FIG. 10(b) shows a circuit schematic for an ESD network. When a positive ESD pulse is applied to the pad 156, the p-n diode 152(b) forward biases, discharging current to the Vdd power rail via the p-n diode as well as current to the substrate via the vertical pnp transistor formed by the p+ implant 151 within the n-well 153, within the p-substrate 40. As the ESD voltage applied to pad 156 exceeds a snapback voltage of the SOI MOSFET transistor 154, the SOI MOSFET transistor 154 will snapback-limit the voltage at the node of the internal active circuitry. When a negative ESD pulse is applied to the pad 156, the n-well diode 152(a) forward biases, discharging current to the Vss substrate 40 as well as current to the substrate via the SOI MOSFET transistor 154. The SOI MOSFET 154 will respond as a forward biased npn transistor in the later instance.

Figure 11A:
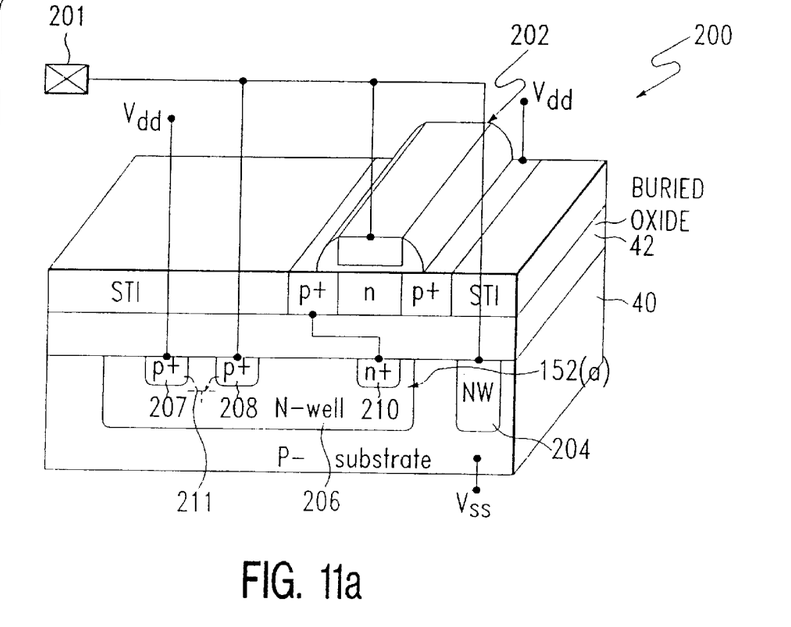
FIGS. 11(a) and 11(b) illustrate another embodiment of an ESD network including a circuit having both bulk ESD bipolar elements and SOI thin film p-channel MOSFET elements.
Figure 11B:
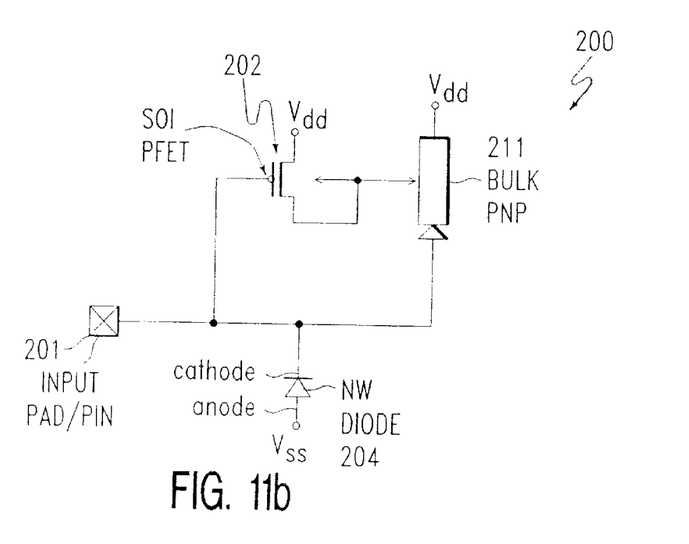

FIGS. 11(a) and 11(b) illustrate yet another embodiment of an ESD network 200 according to the present invention including a circuit having both bulk ESD bipolar elements and an SOI thin film p-channel MOSFET element 202. The bulk elements include an n-well diode element 204 and a bulk n-well 206. Bulk n-well 206 further includes smaller p+ wells 207 and 208, and n+ well 210, as shown in FIG. 11(a). This embodiment provides an example where an SOI element and bulk elements are integrated into a single ESD network to provide ESD protection. The SOI PFET 202 serves as a means to provide sequence independence and prevent forward biasing of the bulk elements. The SOI PFET 202 thus serves as a bulk well biasing element. The SOI PFET 202 is positioned over the ESD network of the bulk substrate and interconnected to the bulk floating well, for example, using any suitable contact, such as a sidewall contact (not shown). The SOI PFET 202 thus serves as a control circuit of the ESD network 200. In addition, the bulk pnp element 211 serves as a means to discharge an ESD pulse. The bulk well diode 204 acts as a means to discharge a negative ESD pulse. FIG. 11(b) shows a circuit schematic for the ESD network of FIG. 11(a). When a positive ESD pulse is applied to the pad 201, the pnp transistor 211 forward biases, discharging current to the Vdd power rail via the pnp transistor 211. When a negative ESD pulse is applied to the pad 201, the n-well diode 204 forward biases, discharging current to the Vss substrate. The p-channel MOSFET 202 is used to control the well potential to prevent forward bias during a functional operation of active SOI circuitry (not shown) connected to pad 201.

Figure 12A:
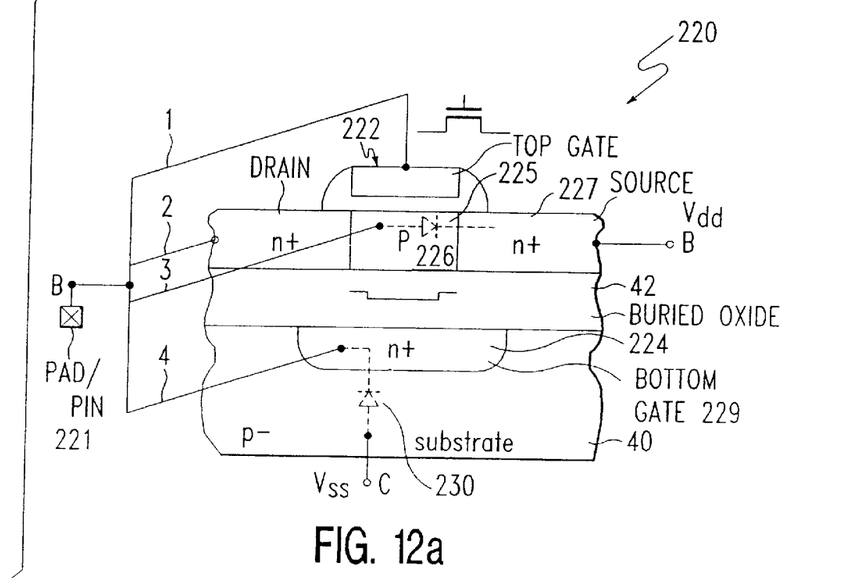
FIGS. 12(a) and 12(b) illustrate another embodiment of an ESD network including a body-coupled and top gate coupled MOSFET, as well as, a second implant below the channel either aligned or not aligned to the channel region which serves as a dual-gate dynamic threshold MOSFET with a diode to the bulk or alternatively as a single-gate dynamic threshold MOSFET with a bulk diode.
Figure 12B:
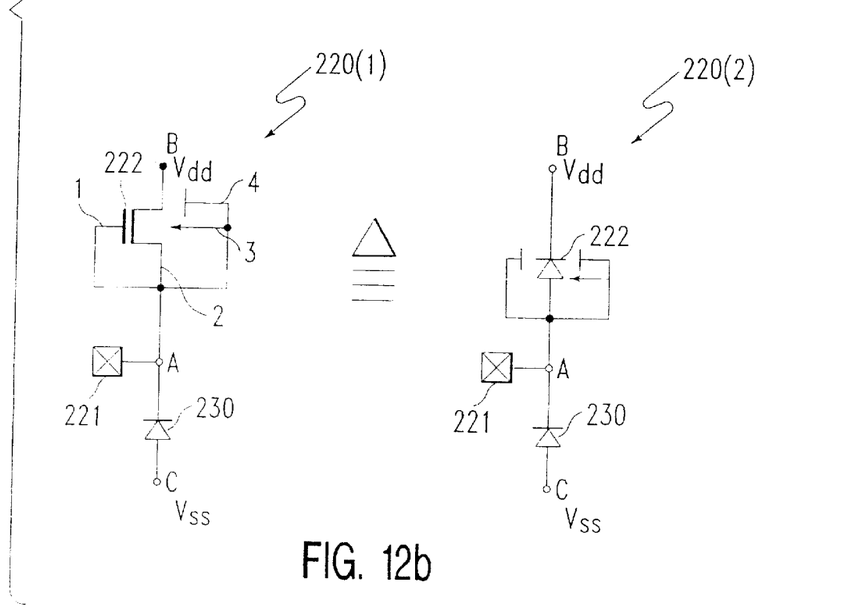

Turning now to FIGS. 12(a) and 12(b), another embodiment of an ESD network is shown. ESD network 220 includes a body-coupled and top gate coupled MOSFET 222, as well as, an n+ implant 224 below the channel either aligned or not aligned to the channel region 226. The top gate 228 and body 226 are coupled to the input node A to create a dynamic threshold MOSFET. The bulk structure below the SOI portion of ESD network 220 can serve as a second gate 229 and a diode 230 to the substrate when placed directly under the channel region 226 of the SOI MOSFET 222, thus forming an ESD network 220(1) having a dual-gate dynamic threshold MOSFET 222 and diode 230. Alternatively, when the bulk n+ well structure 224 is not placed under the channel region, the resulting ESD network structure 220(2) formed thereby acts as a single-gate dynamic threshold MOSFET 222 and diode 230. FIG. 12(b) shows a circuit schematic for the ESD network of FIG. 12(a). When a positive ESD pulse is applied to the pad 221, the p-n diode 225 formed between the SOI MOSFET body 226 and source implant 227 forward biases discharging the current to the source and the power rail Vdd. Additionally, as the body 226 rises, a threshold voltage of the top (222) and bottom (229) gate decreases. When the threshold voltage is achieved for the top and bottom SOI MOSFET surfaces, current flows from drain to source along both surfaces. The turn-on of top or bottom is a function of the threshold voltage of the top and bottom surface. When a negative ESD pulse is applied to the pad 221, the n-well diode 230 formed by the bottom gate structure forward biases, discharging current to the Vss substrate 40.

The method of producing the ESD network structures in accordance with the present invention shall now be discussed and can be accomplished using fabrication techniques known in the art. For example, fabrication of an ESD structure can begin with providing a commercially available SOI silicon wafer having a substrate, an oxide layer, and a thin silicon film. Alternatively, an SOI wafer for use in fabricating ESD structures in accordance with the present invention can be provided using SIMOX (separation by implanted oxygen) or SIBOND (wafer-bonding and etch back). SIMOX and SIBOND techniques achieve low defect density, thin film control, good minority carrier lifetimes, and good channel mobility characteristics. Using a SIBOND process, all of the bulk portions of the ESD structures can be first implanted under the buried oxide layer as necessary. The implants include defined shapes as established using known processes. Alternatively, the ESD structures can be fabricated beginning with a bulk wafer having an oxide layer on top thereof. A second silicon wafer can then be attached to the oxide layer of the first wafer, then bonded and etched back (known in the art as "bond and etch back") to form a desired thin silicon film. The silicon thin film can then be used for fabrication of the SOI portion of the ESD structures of the present invention. Normal processing is then carried out for fabrication of the bulk devices and SOI devices of the ESD networks as discussed herein.

Using a SIMOX process, implants into the bulk substrate are conducted through the buried oxide layer. Little or no implant damage occurs in the thin silicon layer. Implant damage occurs where the atoms of the implant stop. The SIMOX process begins with implanting of oxygen ions into a bulk silicon wafer, followed by an appropriate anneal to remove any implant damage, and thus create a buried oxide layer.

Once having an SOI wafer, appropriate implants are conducted to form the bulk device portions of the ESD structures. Implants necessary for the MOSFET or Si thin film portions of the ESD structures are then carried out. Subsequent to the implants, appropriate interconnects are made between the thin film portions and bulk substrate portions of the ESD structure, as necessary. The interconnects can be made using standard interconnect processes known in the art. For example, the interconnects may include titanium-aluminum-based wiring, tantalum-copper-based wiring, or standard tungsten studs. The dielectrics used can be standard oxides such as used in back-end-of-line processing, or alternatively, low-k (dielectric constant) dielectrics.

There has been shown a 3-D CMOS-on-SOI ESD method and apparatus which provides circuits and structures to prevent electrical overstress of thin film SOI active core circuitry. Such a method and apparatus advantageously provides structures for ESD networks that utilize both bulk and thin film SOI ESD structures. Furthermore, the method and apparatus of the present invention can be constructed without utilizing large active semiconductor chip areas.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. For example, all dopants of polarity n-type can be switched to a p-type polarity and vice-versa. Additionally, construction of new circuits comprising of diodes, lateral pnp or npn transistors, vertical pnp or npn transistors, or combination thereof to form pnpn and npnp silicon controlled rectifiers (SCR) is understandable from the specific implementations shown. For example, adding dual well, triple well, buried layers and other implants, new elements and modifications of the base elements understood in the application can be created to form new ESD networks. It is also understood that resistor elements or capacitive elements can be created from the well implants and n+ or p+ bulk implants. For example, an n-well resistor can be created by using two contacts to the n-well structure. In addition, an n+ or p+ resistor can be created by using two contacts to an implant structure. Hence the embodiments disclosed herein propose bulk elements, whereas they consist of diodes, transistors, silicon controlled rectifiers, resistors and capacitors, can be combined and permutated with SOI thin film elements to provide new ESD networks within the spirit and scope of the present invention. Such new circuits and ESD networks can be designed from the specified elements in the present application.

Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A three-dimensional (3-D) CMOS-on-SOI (Complementary-Metal-Oxide-Semiconductor on Silicon-on-Insulator) electrostatic discharge (ESD) structure comprising:
   an SOI substrate including a silicon thin film layer separated from a bulk silicon substrate by an insulator;
   an integrated circuit structure formed in the thin film of said SOI substrate; and
   an ESD network formed in the bulk silicon substrate underneath said integrated circuit structure.

2. The 3-D CMOS-on-SOI ESD structure of claim 1, wherein
   said integrated circuit structure includes a MOSFET (metal oxide semiconductor field effect transistor) structure.

3. The 3-D CMOS-on-SOI ESD structure of claim 1, wherein
   said integrated circuit structure includes an SOI portion of a three-dimensional (3-D) ESD network, and
   said ESD network formed in the bulk silicon substrate includes a bulk portion of the 3-D ESD network.

4. The 3-D CMOS-on-SOI ESD structure of claim 3, wherein
   the SOI portion is a second stage of the 3-D ESD network.

5. The 3-D CMOS-on-SOI ESD structure of claim 1, wherein
   said ESD network includes a bulk double diode in a bulk buried well resistor, and
   said integrated circuit structure includes an SOI grounded gate MOSFET positioned over the bulk double diode.

6. The 3-D CMOS-on-SOI ESD structure of claim 1, wherein
   said ESD network includes a bulk punch through device, and said integrated circuit structure includes an SOI grounded gate MOSFET positioned over the bulk punch through device.

7. The 3-D CMOS-on-SOI ESD structure of claim 1, wherein said ESD network includes a bulk pnpn silicon-controlled rectifier (SCR), and said integrated circuit structure includes an SOI MOSFET ESD network positioned over the bulk pnpn SCR.

8. The 3-D CMOS-on-SOI ESD structure of claim 1, wherein said ESD network includes a first bulk ESD network, and said integrated circuit structure includes an SOI MOSFET ESD network positioned over the first bulk ESD network, the first bulk ESD network for modulating a surface potential of a bottom surface of the SOI MOSFET ESD network.

9. The 3-D CMOS-on-SOI ESD structure of claim 1, wherein said ESD network includes a bulk p+ implant in a bulk floating well, and said integrated circuit structure includes an SOI p-type MOSFET (PFET) positioned over the ESD network and interconnected to the bulk floating well using a sidewall contact, the SOI PFET for use as a control circuit of the ESD network.

\* \* \* \* \*